(12) United States Patent
Furuyama

(10) Patent No.: US 7,880,254 B2
(45) Date of Patent: Feb. 1, 2011

(54) SEMICONDUCTOR LIGHT RECEIVING DEVICE AND METHOD FOR MANUFACTURING SAME

(75) Inventor: Hideto Furuyama, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 398 days.

(21) Appl. No.: 12/170,016

(22) Filed: Jul. 9, 2008

(65) Prior Publication Data

US 2009/0020839 A1    Jan. 22, 2009

(30) Foreign Application Priority Data

Jul. 9, 2007    (JP) .............................. 2007-179410

(51) Int. Cl.
*H01L 31/0203* (2006.01)
(52) U.S. Cl. ..................... 257/434; 257/433; 257/680; 257/E31.117; 257/E31.119; 257/E23.128; 257/E23.13
(58) Field of Classification Search ......... 257/431–434, 257/680, E31.117, E31.118, E31.119, E31.12, 257/E23.128, E23.129, E23.13, E23.131
See application file for complete search history.

(56) References Cited

U.S. PATENT DOCUMENTS

| 5,638,818 | A | 6/1997 | Diab et al. |
| 6,781,209 | B1 | 8/2004 | Althaus et al. |
| 7,307,250 | B2 | 12/2007 | Kaneko et al. |
| 7,352,935 | B2 | 4/2008 | Furuyama et al. |
| 7,648,775 | B2 * | 1/2010 | Wakako et al. ............... 428/636 |
| 7,687,815 | B2 * | 3/2010 | Kim ............................. 257/98 |
| 2005/0274871 | A1 | 12/2005 | Li et al. |
| 2006/0267124 | A1 * | 11/2006 | Yamazaki ................... 257/432 |

FOREIGN PATENT DOCUMENTS

| JP | 2000-277761 | 10/2000 |
| JP | 2004-241630 | 8/2004 |

OTHER PUBLICATIONS

U.S. Appl. No. 12/164,502, filed Jun. 30, 2008, Hideto Furuyama.

* cited by examiner

*Primary Examiner*—Matthew E Warren
(74) *Attorney, Agent, or Firm*—Oblon, Spivak, McClelland, Maier & Neustadt, L.L.P.

(57) ABSTRACT

A semiconductor light receiving device includes a light receiving section made of a semiconductor provided on a substrate, an electrode provided on the substrate and configured to apply an electric field to the light receiving section, a resin layer provided above the substrate, the resin layer having an inverted conical opening, the inverted conical opening being located above the light receiving section and having an opening diameter which is smaller than the light receiving section in the vicinity of the light receiving section, is continuously enlarged with the distance from the substrate, and is larger than the light receiving section at a surface of the resin layer, and a light reflecting film made of metal and provided on a bevel of the inverted conical opening, the light reflecting film being electrically isolated from the electrode by a gap formed between the light reflecting film and the electrode. At least a portion of the resin layer located in the gap has a light blocking property.

20 Claims, 8 Drawing Sheets

SEMICONDUCTOR LIGHT RECEIVING DEVICE AND METHOD FOR MANUFACTURING SAME

CROSS-REFERENCE TO RELATED APPLICATIONS

This application is based upon and claims the benefit of priority from the prior Japanese Patent Application No. 2007-179410, filed on Jul. 9, 2007; the entire contents of which are incorporated herein by reference.

BACKGROUND OF THE INVENTION

The performance improvement of electronic devices such as bipolar transistors and field-effect transistors has dramatically increased the operating speed of large-scale integrated circuits (LSI). However, despite high speed operation inside LSI, the interconnection speed at the level of the printed circuit board on which the LSI is mounted is set lower than inside LSI, and the interconnection speed at the level of the rack on which the printed circuit board is installed is set even lower. These are attributed to the increase of transmission loss, noise, and electromagnetic interference associated with the increase of operating frequency, because a longer interconnect requires a lower operating frequency in order to ensure adequate signal quality. Hence, a recent growing trend in electrically interconnected apparatuses is that mounting technology is more dominant in system performance than LSI speed.

In view of the foregoing problem with electrically interconnected apparatuses, some proposals have been made for an optically interconnected apparatus, which includes optical interconnection between LSIs (e.g., JP-A 2004-241630 (Kokai), hereinafter referred to as Patent Document 1). Optical interconnection has little frequency dependence of loss in the frequency range from DC to 100 GHz or more, and free from electromagnetic interference with the interconnect path and noise due to ground potential difference, allowing interconnection at several 10 Gbps to be easily realized. Cost-effective optical interconnection requires an optical transmission system that can ensure large mounting margin and operating margin with simple configuration. However, the conventional technique mentioned above relates to enhancing light collection performance in the light receiving section of a semiconductor light receiving device, yet inadequate for ensuring mounting margin in the external optical coupling of a semiconductor light receiving device.

SUMMARY OF THE INVENTION

According to an aspect of the invention, there is provided a semiconductor light receiving device including: a light receiving section made of a semiconductor provided on a substrate; an electrode provided on the substrate and configured to apply an electric field to the light receiving section, the electrode being in contact with a surface of the light receiving section; a resin layer provided above the substrate, the resin layer having an inverted conical opening having a periphery surrounded by the resin layer, the inverted conical opening being located above the light receiving section and having an opening diameter which is smaller than the light receiving section in the vicinity of the light receiving section, is continuously enlarged with the distance from the substrate, and is larger than the light receiving section at a surface of the resin layer; and a light reflecting film made of metal and provided on a bevel of the inverted conical opening, the light reflecting film being electrically isolated from the electrode by a gap formed between the light reflecting film and the electrode, at least a portion of the resin layer located in the gap having a light blocking property.

According to another aspect of the invention, there is provided a semiconductor light receiving device including: a light receiving section made of a semiconductor provided on a substrate; an electrode provided on the substrate and configured to apply an electric field to the light receiving section, the electrode being in contact with a surface of the light receiving section; a resin layer provided above the substrate, the resin layer having an inverted conical opening having a periphery surrounded by the resin layer, the inverted conical opening being located above the light receiving section and having an opening diameter which is smaller than the light receiving section in the vicinity of the light receiving section, is continuously enlarged with the distance from the substrate, and is larger than the light receiving section at a surface of the resin layer; and a light reflecting film made of metal and provided on a bevel of the inverted conical opening, the light reflecting film being electrically isolated from the electrode by a gap formed between the light reflecting film and the electrode, a light being blocked from being incident on the substrate except the light receiving section.

DETAILED DESCRIPTION OF THE INVENTION

Figure 1:
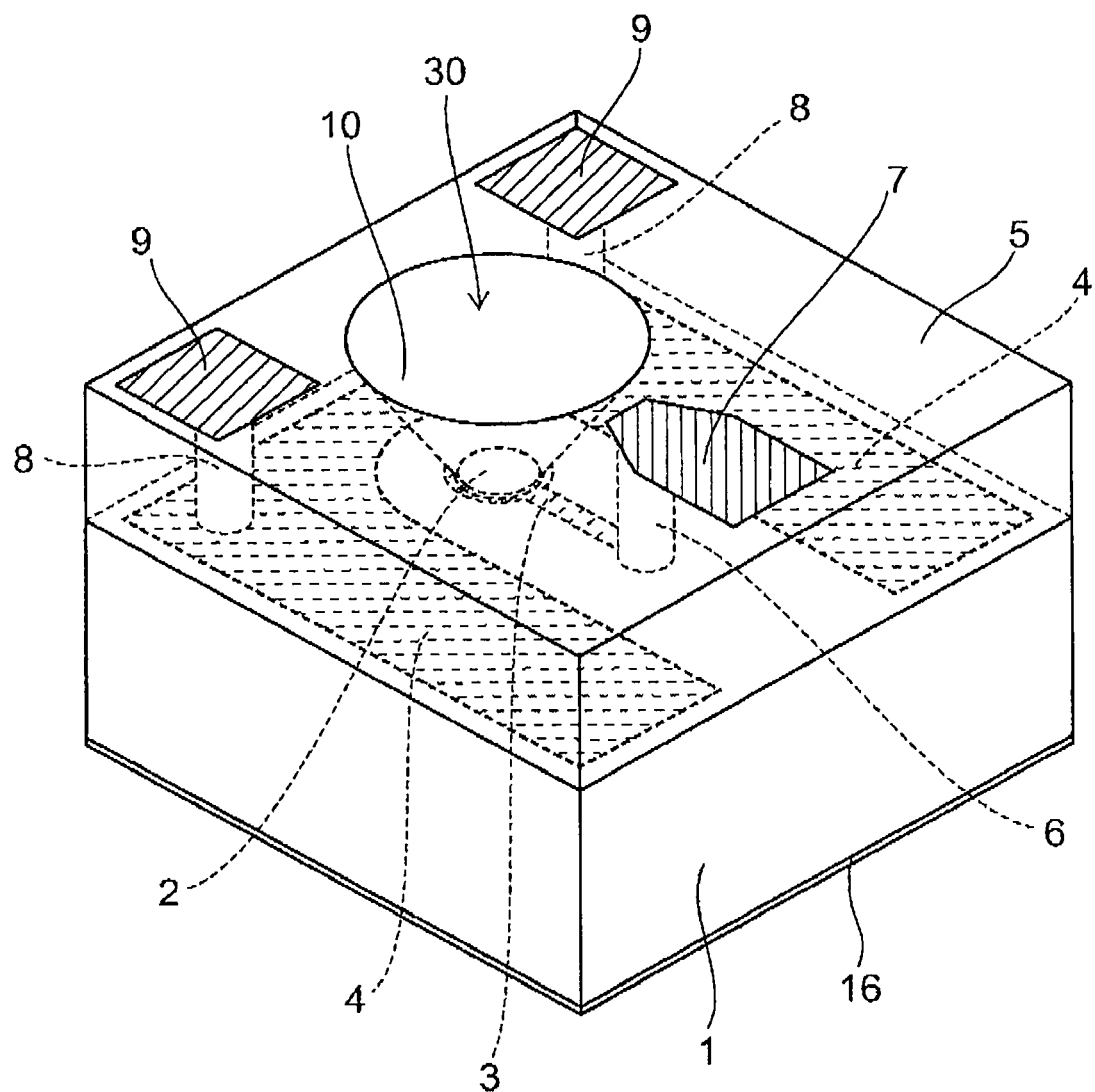
FIG. 1 is a perspective view showing the schematic configuration of a semiconductor light receiving device according to a first embodiment.

In the conventional technique of Patent Document 1, a small lens is disposed on the light receiving section of a semiconductor light receiving device, which allows the light receiving section to receive light at a wide angle. However, in the conventional configuration with a lens disposed on the light receiving section, in the case where a refractive index matching material for blocking reflected return light is provided at the optical coupling to an optical transmission line (such as an optical fiber), the lens effect is difficult to achieve because of small refractive index difference between the lens and the refractive index matching material.

Thus, conventional optical interconnections have difficulty in addressing reflected return light, which is relevant to using a semiconductor laser as a light source, that is, difficulty in high-speed optical interconnection. Furthermore, in the case where a multi-mode fiber, which facilitates optical coupling on the light emitting device side, is used in the above conventional techniques, the area in which the semiconductor light receiving device can receive all the transmission modes is narrow. Consequently, modal noise is likely to occur, also causing the problem of decreased operating margin or mounting margin.

In contrast, in the embodiments of the invention, a semiconductor light receiving device is provided with a light collector based on an inverted conical opening to prevent the decrease of optical coupling due to optical coupling misalignment. Furthermore, in forming a light reflecting film for forming the light collector based on the inverted conical opening with good reproducibility, an intermediate layer having an isolated pattern is provided in a region of the light receiving section and selectively removed.

Thus, the embodiments of the invention can provide a semiconductor light receiving device which facilitates constructing parallel optical interconnection with high density and also facilitates addressing reflected return light in the case of using a semiconductor laser as a light source. Furthermore, also in the case of using a multi-mode fiber, which is easy to be optically coupled to a light emitting device, the area in which all the transmission modes can be received is large, consequently preventing occurrence of modal noise. Hence, a semiconductor light receiving device with large operating margin and mounting margin can be realized. Thus, the present embodiments can significantly facilitate practical application and cost reduction of optical interconnection apparatuses, contributing greatly to the sophistication of information and communication equipment.

The embodiments of the invention will now be described in detail with reference to the drawings. While several specific materials are referred to herein, the embodiments can be similarly practiced using any materials suitable for a semiconductor light receiving device, and the invention is not limited to the following embodiments. Furthermore, the following description will be made by extracting a light receiving device. However, it is understood that any peripheral configuration not described in the embodiments of the invention can be optionally added, such as integration with a transimpedance amplifier. Furthermore, the following description focuses on a so-called PIN photodiode serving as a functional structure of the semiconductor light receiving device. However, the embodiments are applicable to various semiconductor light receiving devices such as an MSM (metal-semiconductor-metal) photodiode, photoconductor, and phototransistor.

First Embodiment

Figure 2:
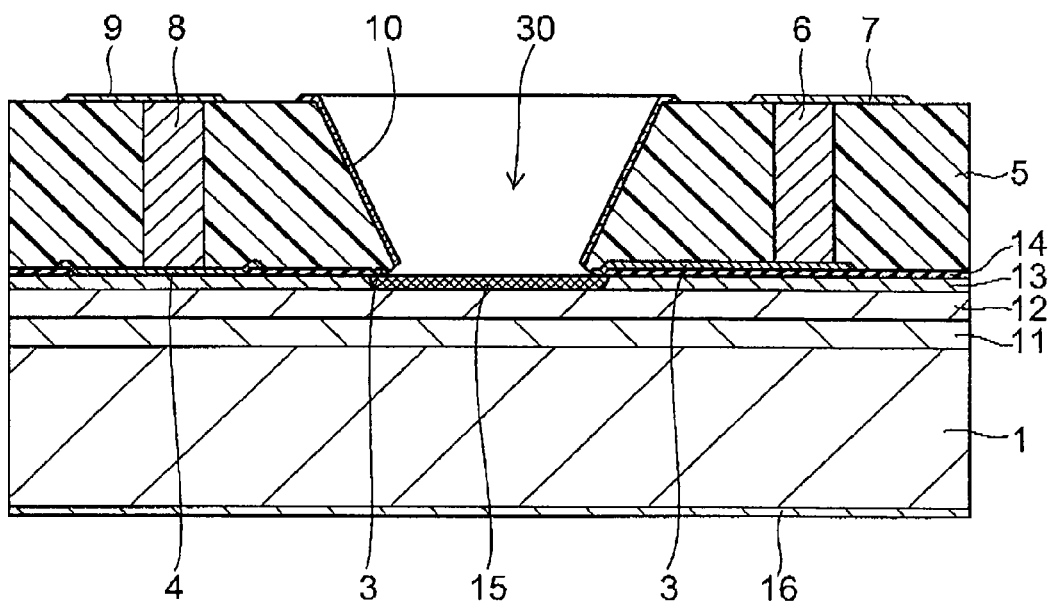
FIG. 2 is a cross-sectional view of the configuration of the embodiment of FIG. 1.
Figure 3:
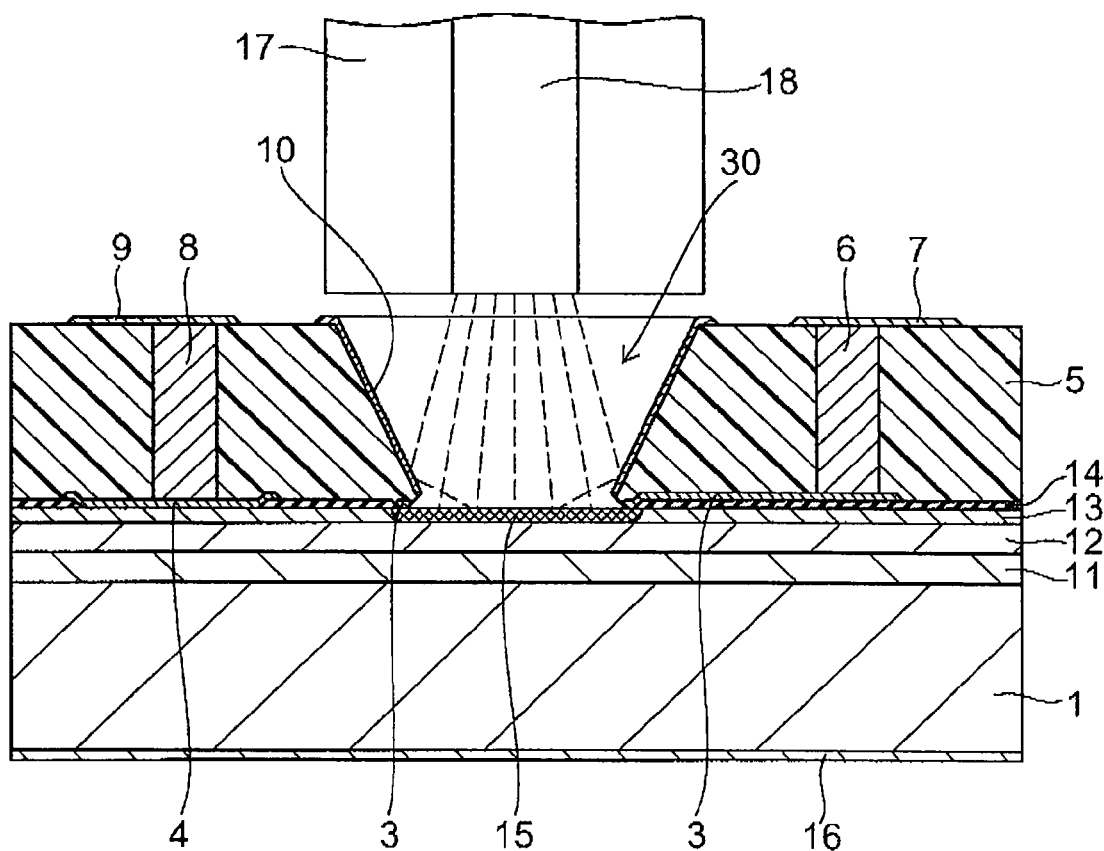
FIG. 3 is a schematic view of the states of optical coupling of the embodiment of FIG. 1 to an optical line.
Figure 4:
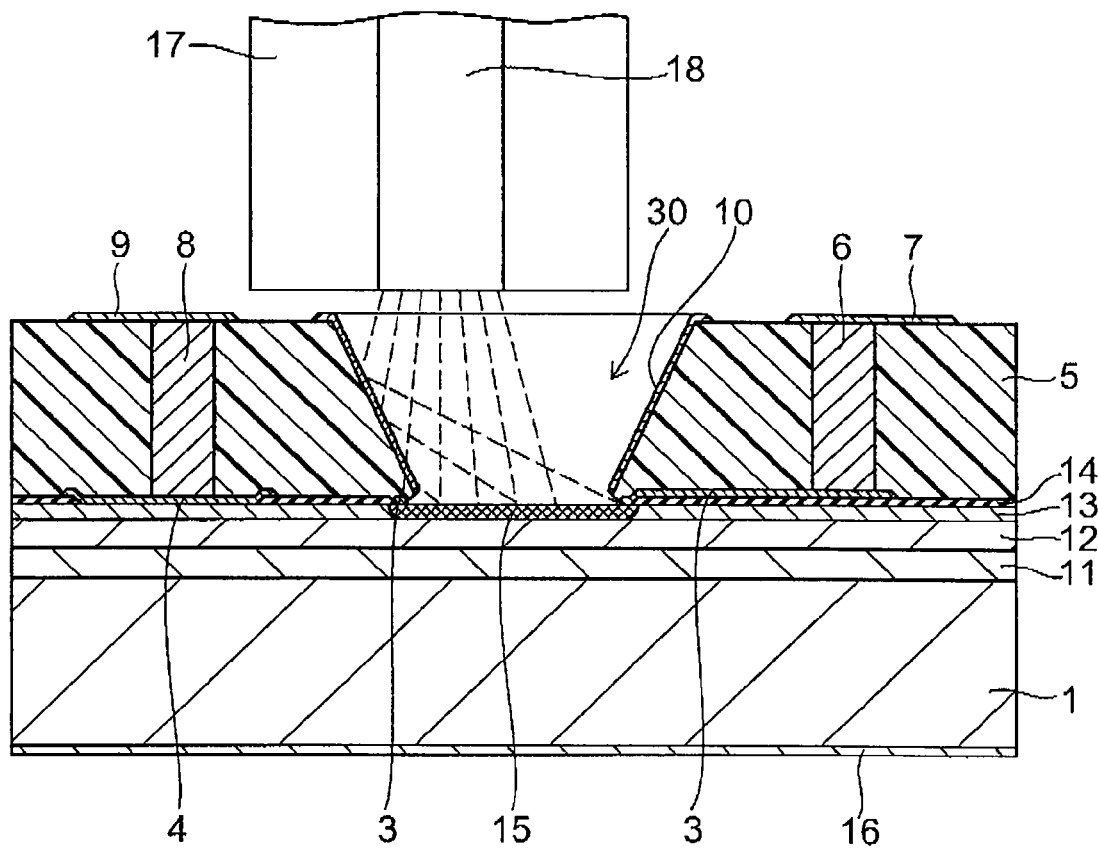
FIG. 4 is a schematic view of the states of optical coupling of the embodiment of FIG. 1 to an optical line.

FIG. 1 is a perspective view showing the schematic configuration of a semiconductor light receiving device according to a first embodiment of the invention, FIG. 2 is a cross-sectional view of the configuration of the embodiment of FIG. 1, and FIGS. 3 and 4 are schematic views of the states of optical coupling of the embodiment of FIG. 1 to an optical line (optical fiber, optical waveguide, etc.). GaInAs/InP-based materials are illustratively used herein as specific constituent materials. However, as described above, it is also possible to use other materials such as GaAlAS/GaAs-based, SiGe/Si-based, GaN/Si-based, and SiC/Si-based materials. Furthermore, the light receiving section made of the above semiconductor materials can be laminated with a glass substrate or ceramic substrate after the original substrate is removed.

As shown in FIG. 1, the semiconductor light receiving device includes an n-type InP substrate 1, a light receiving section 2, a p-side electrode 3 (such as Au/Pt/Ti and Au/Cr), an n-side electrode 4 (such as AuGe and AuSn), a resin layer 5 (such as polyimide resin, acrylic resin, and epoxy resin), a p-side through electrode 6 (such as Au), a p-side pad electrode 7 (such as Au/Pt/Ti and Au/Cr), an n-side through electrode 8 (such as Au), an n-side pad electrode 9 (such as Au/Pt/Ti and Au/Cr), and a light reflecting film 10 (such as Au/Pt/Ti and Au/Cr). As shown in FIGS. 2, 3, and 4, the semiconductor light receiving device further includes an n-type InP buffer layer 11, a low-concentration GaInAs light receiving layer 12, an n-type InP window layer 13, an insulating layer 14 including silicon nitride (passivation film) at the bottom, a p-type diffusion layer 15 (e.g., Zn diffusion layer), a backside electrode 16 (backside n-side electrode, such as AuGe and AuSn), a cladding 17 (light confining portion of the optical line), and a core 18 (light waveguiding portion of the optical line). The dashed line in FIGS. 3 and 4 schematically shows an optical path (ray trajectory) from the optical line. The light receiving section 2 corresponds to an electric field applied region of the GaInAs light receiving layer 12 underlying the p-type diffusion layer 15. However, in view of the incidence of light through the p-type diffusion layer 15, the p-type diffusion layer 15 and the underlying GaInAs light receiving layer 12 subjected to an electric field are herein collectively referred to as the light receiving section 2.

The semiconductor light receiving device according to this embodiment, which has a light receiving section 2 made of a semiconductor on the substrate 1, includes a resin layer 5 provided above the substrate 1. The resin layer 5 has an inverted conical opening 30 located above the light receiving section 2. The opening diameter of the inverted conical opening 30 is smaller than the light receiving section 2 in the vicinity of the light receiving section 2, is continuously enlarged with the distance from the substrate 1, and constitutes an opening end larger than the light receiving section 2 at the surface of the resin layer 5. The semiconductor light receiving device further includes a metallic light reflecting film 10 provided on the bevel of the inverted conical opening 30 and electrically insulated from the electrode 3 of the light receiving section 2. The resin layer 5 is partly or entirely made of an opaque resin and preferably blocks light from being incident on the portion of the substrate 1 outside the light receiving section 2. Preferably, the inverted conical opening 30 of the resin layer 5 is further filled with a transparent resin.

As shown in FIG. 1, the light reflecting film 10 is formed on the surface of the inverted conical opening 30 (tapered opening) to constitute a light collector. Here, the term "inverted conical opening" generically refers to an opening shaped so that a polygonal pyramid or circular cone with its top truncated (frustum of a polygonal pyramid or circular cone) is turned upside down, and an opening having one of these shapes in which the cross section of its bevel is other than a straight line (e.g., parabola). In the following description, an opening shaped like an inverted frustum of a circular cone is taken as an example.

In the inverted conical opening 30, for example, the resin layer 5 has a thickness of 70 μm, the bevel angle with respect to the surface of the substrate 1 is 65°, the opening diameter in the vicinity of the light receiving section 2 is 70 μm (top opening diameter is approximately 135 μm), and the diffusion region diameter of the p-type diffusion layer 15 is 80 μm. With this diameter of the p-type diffusion region, an optical signal at 10 Gbps or more can be received by optimizing the impurity concentration and thickness of the n-type InP buffer layer 11 and the low-concentration GaInAs light receiving layer 12.

By this configuration, the light receiving section 2 is equivalent to a semiconductor light receiving device having a light receiving diameter of 70 μm. As shown in FIG. 3, up to a certain incident angle, incident light lying off the light receiving diameter (the diameter of the inverted conical opening in the vicinity of the light receiving section) is also reflected and introduced into the light receiving section 2. For example, in a standard GI (graded index) optical fiber (core diameter 50 μm, NA-0.21), the maximum spread angle of output light is approximately 12°. In the case where this optical fiber applies light to the surface of the semiconductor light receiving device of this embodiment from its vicinity as shown in FIG. 3, the spread distance at the light receiving surface is approximately 15 μm. The maximally spread light outputted from the edge of the optical fiber core 18 is located at approximately 40 μm away from the center, and fails to be directly incident on the light receiving section 2. However, this maximally spread light is returned to the light receiving section 2 through reflection by the bevel of the light collector based on the inverted conical opening 30, consequently avoiding optical loss.

Furthermore, as shown in FIG. 4, in the case where the optical fiber for inputting light is located off-axis to some extent, optical coupling loss can be prevented by the light collecting effect of the light collector based on the inverted conical opening 30. In the case of the standard GI optical fiber described above, optical loss can be avoided up to an axial misalignment of 20 μm or more.

Thus, in the semiconductor light receiving device of this embodiment, the optical line for inputting light has a very large allowance for positional misalignment. Furthermore, in contrast to the continuous dependence of optical loss on the off-axis distance as in the conventional lens coupling, this embodiment provides an effectively lossless region in which little optical coupling loss occurs up to a certain off-axis distance. Hence, in the case of optical transmission using a so-called multi-mode optical fiber having a very large number of optical propagation modes, this embodiment has a great advantage of being able to prevent all modal noise, which tends to interfere with multi-mode optical transmission, up to a certain off-axis distance. In the case of lens coupling, for example, there is a region with a relatively small optical loss. However, the optical loss in this case directly corresponds to optical mode loss, which leads up to the so-called modal noise. Hence, lens coupling has the potential drawback of modal noise also in the case where the amount of optical loss is negligible. In contrast, this embodiment eliminates this drawback, and further has the advantage of being able to ensure allowance for the axial misalignment of optical lines. That is, this embodiment provides mounting margin for the axial misalignment of optical lines as well as operating margin for modal noise. Hence, the optical line can be adequately coupled to the semiconductor light receiving device using a simple configuration such as the so-called butt-joint coupling configuration as shown in FIG. 3.

In FIGS. 1 to 4, the inside of the light collector based on the inverted conical opening 30 is left as a void in use. However, in the case of using a semiconductor laser on the light transmitting side to construct a butt-joint coupling similar to the light receiving side of this embodiment, residual reflection (several %) at the end of the optical fiber or other optical line is optically fed back to the semiconductor laser on the light transmitting side, causing the semiconductor laser to produce the so-called optical feedback noise. To prevent this phenomenon, the gap between the optical line and the light receiving section can be filled with a refractive index matching resin having a refractive index close to the equivalent refractive index of the optical line. Also in this case, the effect described above is similarly achieved, and more advantageously, the optical distance is reduced by a factor of the refractive index of the filling resin, thereby increasing the allowance for axial misalignment described above.

Incidentally, in the case of the semiconductor light receiving device with a small lens formed on the light receiving section as disclosed in Patent Document 1, filling with a refractive index matching material as described above extremely decreases the refractive index difference between the lens and the surroundings. Thus, the lens effect is substantially impaired, and the device loses its function. In contrast, the semiconductor light receiving device of this embodiment retains its function irrespective of whether the surrounding medium is air or resin, because the light collector is made of a metallic light reflecting film 10.

With regard to filling with a refractive index matching resin described above, preferably, the inverted conical opening 30 is filled beforehand in the step of manufacturing a semiconductor light receiving device. Thus, when an optical fiber or other optical line is placed closed thereto and the surrounding space is filled, air bubbles can be prevented from remaining in the inverted conical opening 30.

The resin layer 5 is preferably made of an opaque resin rather than a transparent resin. Some gap (a portion with no light reflecting film) is needed between the light reflecting film 10 and the insulating layer 14 in FIG. 2 to prevent the increase of electrical parasitic capacitance due to the light reflecting film 10. Light leaking from this gap is a kind of stray light. Irradiation of a region away from the p-type diffusion region 15 with this stray light produces a diffusion current in the region, which is not subjected to the electric field induced by reverse-biased pn junction. This diffusion current is a light receiving current having a considerably slower response than the drift current in the electric field applied portion. To prevent the diffusion current due to this leakage light or light not incident on the light collector based on the overlying inverted conical opening 30, the resin layer 5 is preferably made of an opaque resin. As another possible structure, a light blocking layer can be provided between the insulating layer 14 and the resin layer 5, which can be transparent or translucent. For example, a light blocking resin containing carbon black can be interposed between the insulating layer 14 and the resin layer 5.

Second Embodiment

Next, an example method for manufacturing a semiconductor light receiving device according to the embodiment of the invention is described. Here, for simplicity, a description is given with reference to figures in which only the neighborhood of the light receiving section is clipped out. Although the process for fabricating the through electrodes 6, 8 and the pad electrodes 7, 9 shown in FIGS. 1 to 4 is not shown here, it can be implemented using conventional processes for patterning, metallization (such as evaporation and plating), and etching, and suitable combinations thereof.

FIGS. 5 to 8 are process cross-sectional views showing the process for manufacturing a light collector based on the inverted conical opening. Elements in common with those in FIGS. 1 to 4 are labeled with common reference numerals.

The method for manufacturing a semiconductor light receiving device according to this embodiment includes, at least: providing a light receiving section made of a semiconductor on a substrate 1; providing at least one intermediate layer 143 on the light receiving section; providing a resin layer 5 on the intermediate layer 143 and providing, in the resin layer 5, an inverted conical opening 30, its opening diameter being smaller than the light receiving section on the intermediate layer 143 overlying the light receiving sections continuously enlarged with the distance from the substrate 1, and constituting an opening end larger than the light receiving section at the surface of the resin layer 5; providing a light reflecting film 10 on the resin layer 5 including the inverted conical opening 30; and subsequently removing the intermediate layer 143 at the bottom of the inverted conical opening 30 to selectively remove the light reflecting film 10 at the bottom of the inverted conical opening 30. Preferably, the intermediate layer 143 is formed as an isolated pattern on the light receiving section, and partly removed before the light reflecting film 10 is provided.

Figure 5A:
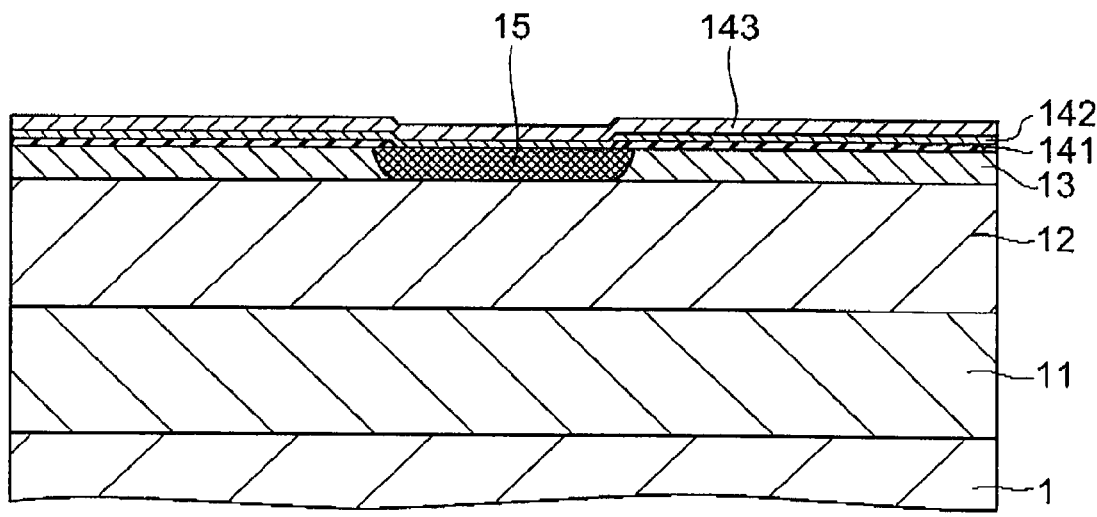
FIGS. 5A, 5B, 6A, 6B, 7A, 7B and 8 are cross-sectional views showing the process for manufacturing a semiconductor light receiving device according to a second embodiment.

First, as shown in FIG. 5A, an n-type InP buffer layer 11, a GaInAs light receiving layer 12, and an n-type InP window layer 13 are crystal grown on an n-type InP layer (substrate) 1 by a crystal growth method such as MO-CVD (metal organic chemical vapor deposition). Next, a silicon nitride ($SiN_x$) film 141 is formed on the n-type InP window layer 13 by a method such as plasma CVD, and an opening is formed by photolithography in the silicon nitride film 141 where the pn junction of the light receiving section is to be formed. Subsequently, thermal diffusion of p-type impurity (e.g., Zn) is performed to selectively form a p-type diffusion layer 15.

Next, after the above process, an AR coating (anti-reflection coating) film 142 of silicon nitride and an intermediate layer 143 of silicon oxide ($SiO_2$) are provided on the surface (FIG. 5). It is sufficient to form the AR coating film 142 so that, with respect to the wavelength λ of light to be received, the product of the refractive index and the film thickness is generally equal to λ/4. If the refractive index of the film is equal to the square root of the product of the refractive index $n_1$ of the semiconductor of the light receiving section (p-type InP 15) and the refractive index $n_2$ of the outside (in the case of air, $n_2=1$), that is, to the square root of $n_1 n_2$, then the reflectance is minimized. For example, at a wavelength of 1.3 μm, the refractive index of p-type InP is approximately 3.3, and it is preferable that the refractive index of the AR coating film 142 be approximately 1.8 in the case where the outside is air, Silicon nitride can be adapted to have a refractive index of 1.8 at the above wavelength, and in that case, it is sufficient to deposit a silicon nitride film with a thickness of approximately 180 nm.

Alternatively, the AR coating film 142 can be a conductive transparent film (e.g., indium tin oxide (ITO)), which serves as an auxiliary electrode for the light receiving section to maximize the effective light receiving area.

The intermediate layer 143 is illustratively made of silicon oxide, deposited to a thickness of approximately 1 μm by thermal CVD. The intermediate layer 143 can be made of any material other than silicon oxide described above, as long as it has a high etching selection ratio with respect to the AR coating film 142 and the resin layer 5 to allow its subsequent selective removal, and is resistant to the processing temperature (curing temperature) of the resin layer 5. Furthermore, the intermediate layer 143 can be made of a multilayer film including two or more films having different etching characteristics so that part of the multilayer film can be selectively removed in the case of half etching described later.

Figure 5B:
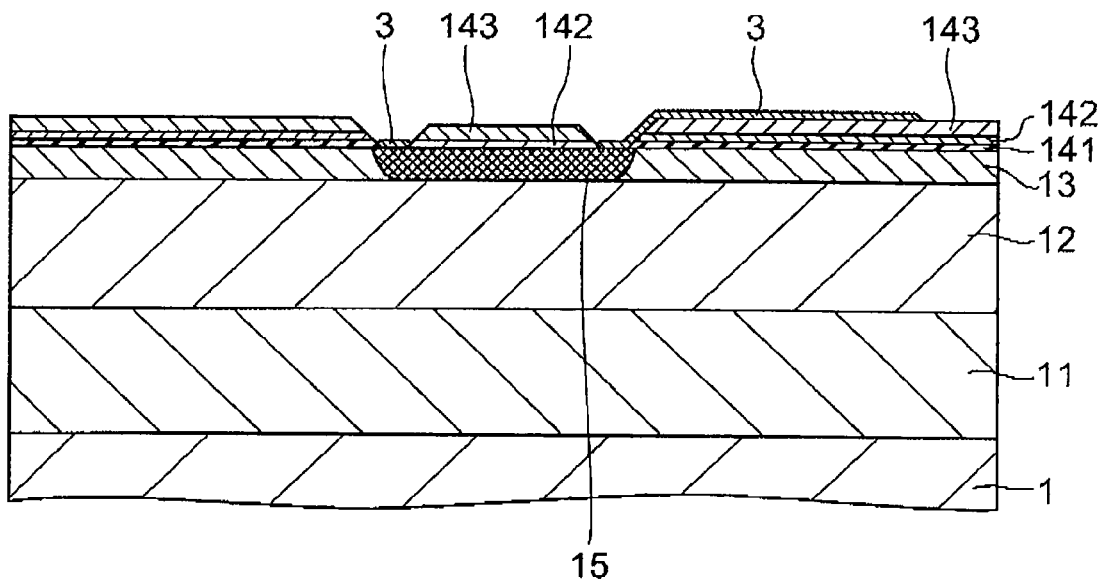

Next, as shown in FIG. 5B, part of the intermediate layer 143 and the AR coating film 142 is selectively removed to expose the p-type diffusion layer 15, and a p-side electrode 3 is formed by a film formation method such as evaporation on the exposed portion. As described above, in the case of using a conductive transparent film (transparent electrode) for the AR coating film 142, the transparent electrode 142 together with the intermediate layer 143 is etched and separated into an isolated pattern at a position where the transparent electrode 142 partly overlaps the silicon nitride film 141 (p-type impurity diffusion mask). Part of the isolated transparent electrode 142 is exposed and provided with a p-type electrode 3.

A resin layer 5 is formed, and an inverted conical opening is simultaneously formed above the light receiving section. The resin layer 5 can be made of polyimide resin, acrylic resin, or epoxy resin as described above, and it can be formed by patterning of a photosensitive resin using exposure and development. A formation method based on nanoimprinting is illustrated as a method for forming an Inverted conical opening with an arbitrary shape in a thick resin film.

Figure 6A:
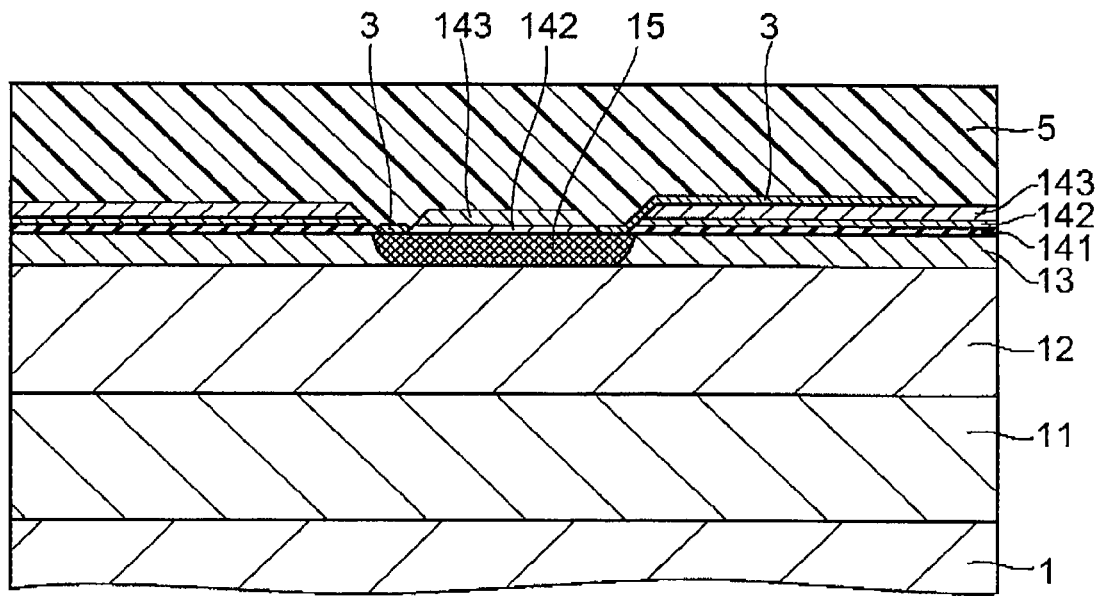
Figure 6B:
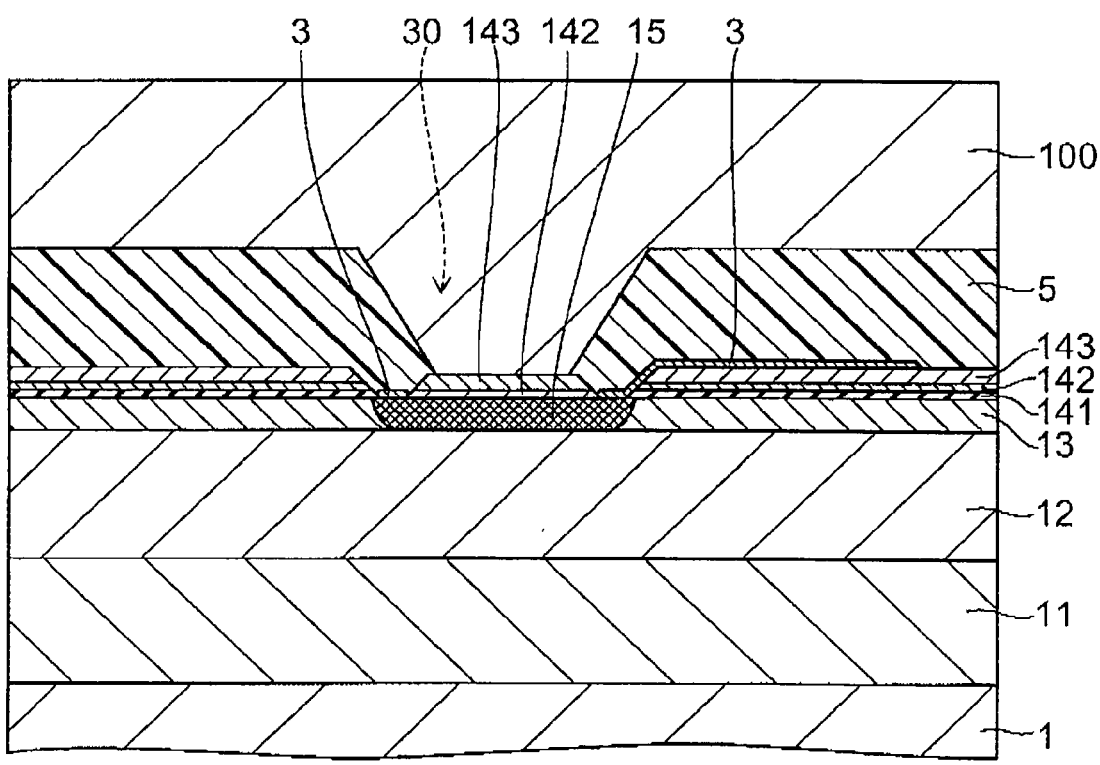

First, the semiconductor light receiving device as shown in FIG. 5B is evenly coated with a resin layer 5 illustratively made of polyimide resin by a technique such as spin coating, roll coating, and dispense coating (FIG. 6A). Next, as shown in FIG. 6B, a mold 100 of the inverted conical opening made by Ni electroforming is aligned and pressed, and resin curing such as heat treatment is performed to imprint an inverted conical opening 30. Alternatively, the mold 100 can be made of glass or other transparent material, and the resin layer 5 can be made of an ultraviolet curable resin. Then, resin curing can be instantaneously performed by ultraviolet irradiation through the mold substrate. The height of the flat portion of the mold 100 (the surface of the resin layer 5) is determined by taking the effect of curing shrinkage into consideration so that the thickness of the resin layer 5 is 70 μm after resin curing.

Next, a light reflecting film 10 is formed. The light reflecting film 10 is needed only on the bevel of the inverted conical opening 30 of the resin layer 5. However, in the case where the light receiving section has a small diameter, it is difficult to selectively etch away the bottom of the inverted conical opening 30, that is, its portion on the surface of the light receiving section. Hence, in this embodiment, the intermediate layer 143 described above is used as a spacer for lift-off to selectively remove the light reflecting film 10 in the small opening.

Figure 7A:
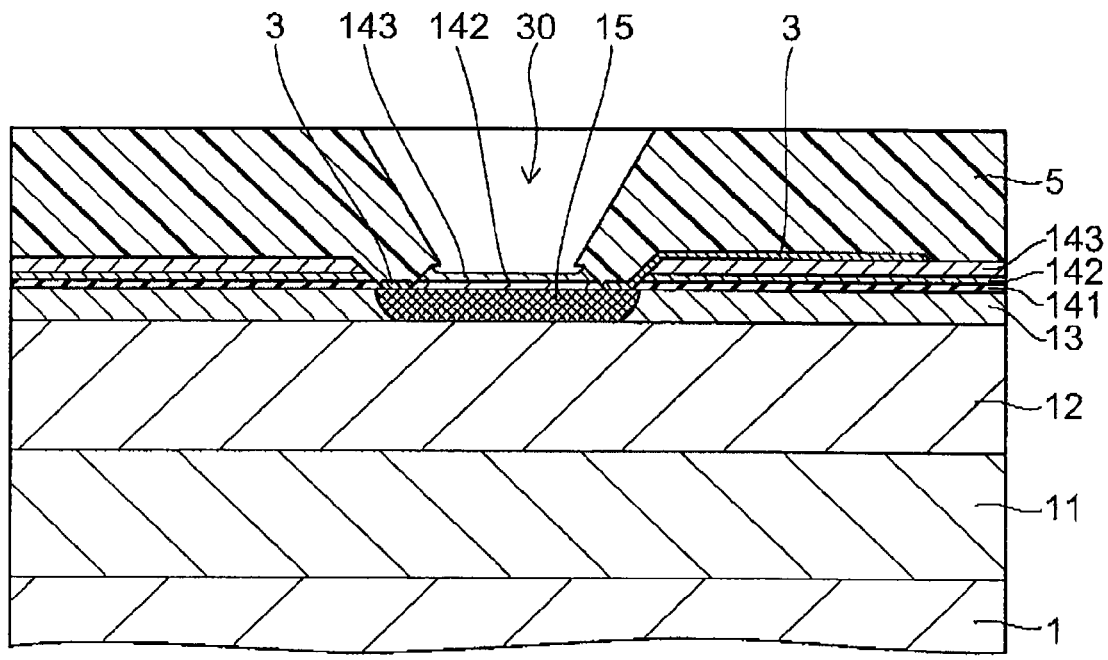
Figure 7B:
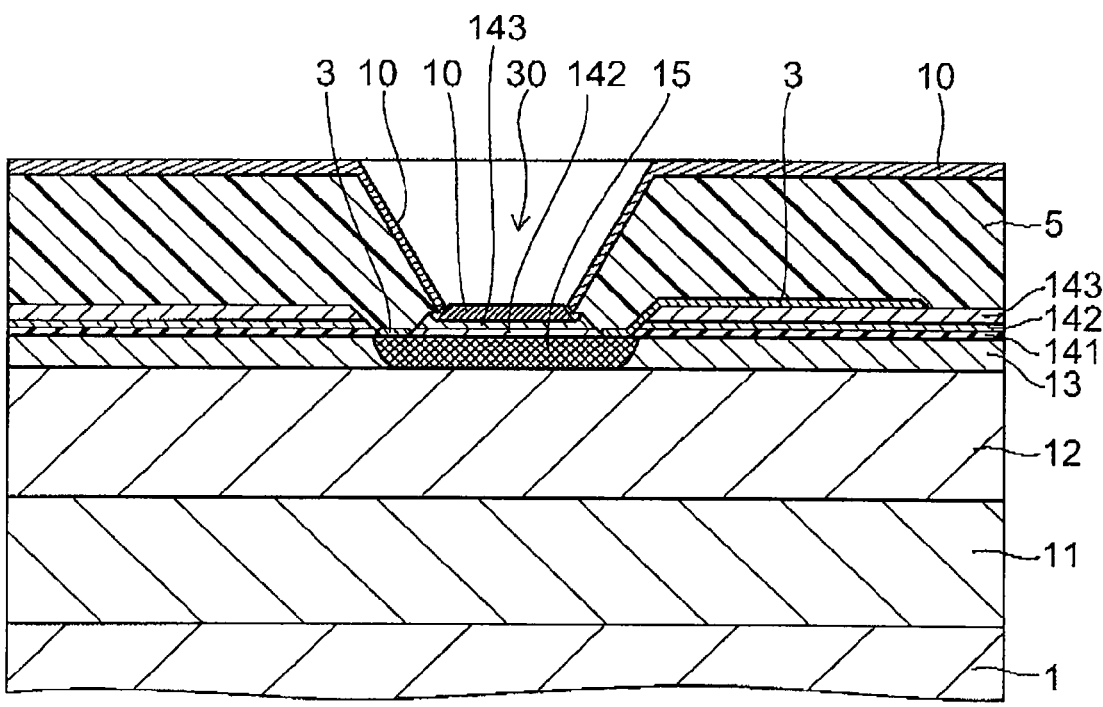

Specifically, the resin layer 5 is used as a mask to selectively etch away the intermediate layer 143 on the upper surface of the light receiving section, thereby selectively removing the light reflecting film 10. To perform this reliably, after the process of FIG. 6B, the intermediate layer 143 on the light receiving section is etched halfway in advance (half etching) as shown in FIG. 7A. This etching process can be illustratively performed by wet etching with ammonium fluoride solution.

By this half etching, the resin residue left on the surface of the intermediate layer 143 by the previous nanoimprinting process is removed, and a step is formed at the boundary with the resin layer 5 by undercutting the intermediate layer 143. In this state, a light reflecting film 10 is formed illustratively by evaporation. Thus, the light reflecting film 10 formed on the light receiving section is separated from the light reflecting film 10 on the bevel of the inverted conical opening 30 by the step described above (FIG. 7B).

Figure 8:
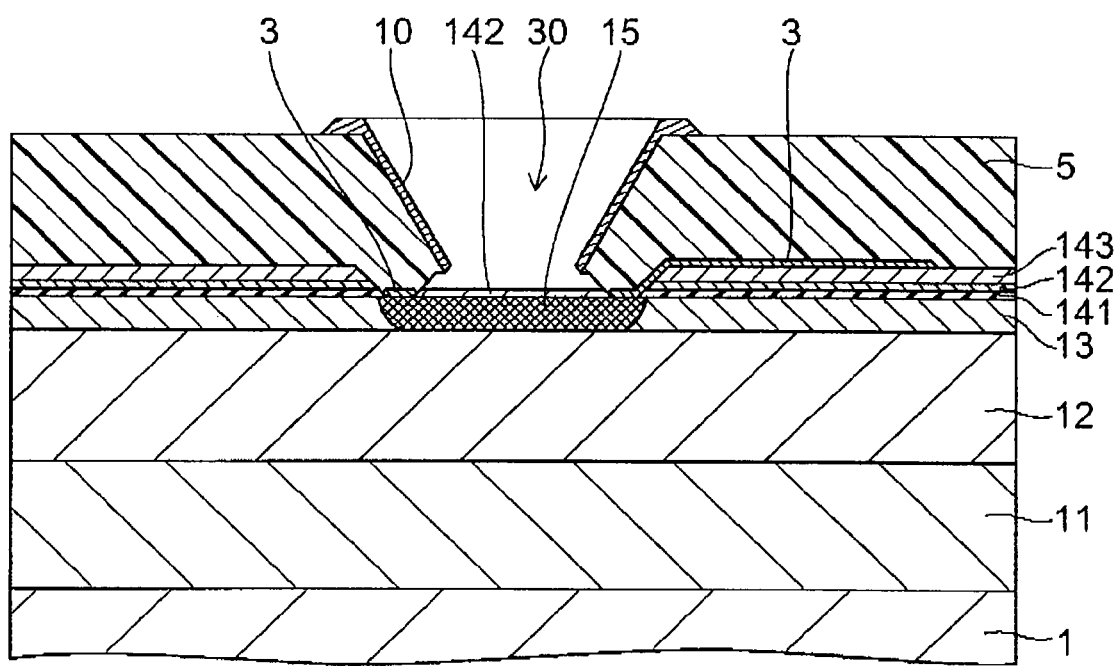

Subsequently, the intermediate layer 143 remaining on the light receiving section is completely etched away. Thus, the light reflecting film 10 on the light receiving section is removed, and the underlying AR coating film 142 is exposed (FIG. 8). The removal of the intermediate layer 143 can be illustratively performed by wet etching with ammonium fluoride solution described above. In this process of wet etching with ammonium fluoride solution, the etching rate of silicon nitride is slower than the etching rate of silicon oxide, allowing the so-called selective etching. Here, the isolated patterning of the intermediate layer 143 on the light receiving section as described above allows the so-called overetching, that is, etching can be performed for a longer time than for just finishing the etching. This facilitates completely removing the residue of the intermediate layer 143.

Finally, the light reflecting film 10 on the portion other than the inverted conical opening 30 is selectively etched away to complete the process (FIG. 8). Here, if the light reflecting film 10 is made of the same metal as the pad electrodes 7, 9 described above, the formation of the pad electrodes 7, 9 can be simultaneously completed with the selective etching of the light reflecting film 10. The etching away may be difficult depending on the metal used. In that case, a photoresist pattern of the portion of the light reflecting film to be removed can be formed on the resin layer 5 before performing the above-described half etching of the intermediate layer 143 on the light receiving section to form a light reflecting film 10. In this case, lift-off by the photoresist allows the light reflecting film 10 to be selectively removed. Although not shown in FIG. 8, a transparent resin for refractive index matching is preferably filled and cured inside the inverted conical opening 30.

Variations

The invention is not limited to the above embodiments. The examples in the above embodiments of the invention are presented only for illustrative purposes to describe the configuration. For example, the elements described above can be modified in various ways (in material, dimension, etc.) within the spirit of the invention. For example, the intermediate layer 143 can be made of a multilayer film including two or more films, and the above-described half etching of the intermediate layer 143 can be replaced by selective etching of the multilayer film to achieve similar effects. That is, the invention can be practiced in various modifications without departing from the spirit of the invention.

The invention claimed is:

1. A semiconductor light receiving device comprising:
a light receiving section made of a semiconductor provided on a substrate;
an electrode provided on the substrate and configured to apply an electric field to the light receiving section;
a resin layer provided above the substrate, the resin layer having an inverted conical opening, the inverted conical opening being located above the light receiving section and having an opening diameter which is smaller than the light receiving section in the vicinity of the light receiving section, is continuously enlarged with the distance from the substrate, and is larger than the light receiving section at a surface of the resin layer; and
a light reflecting film made of metal and provided on a bevel of the inverted conical opening, the light reflecting film being electrically isolated from the electrode by a gap formed between the light reflecting film and the electrode,
at least a portion of the resin layer located in the gap having a light blocking property.

2. The semiconductor light receiving device of claim 1, wherein the resin layer is entirely made of an opaque resin.

3. The semiconductor light receiving device of claim 1, wherein a light blocking layer is provided under the resin layer at least in the portion of the resin layer located in the gap.

4. The semiconductor light receiving device of claim 1, wherein the inside of the inverted conical opening is a void.

5. The semiconductor light receiving device of claim 1, wherein the inside of the inverted conical opening is filled with a transparent resin.

6. The semiconductor light receiving device of claim 5, wherein the transparent resin has a refractive index close to the transmission refractive index of an optical waveguide coupled to the inverted conical opening.

7. The semiconductor light receiving device of claim 1, further comprising: an anti-reflection coating film provided on a surface of the light receiving section.

8. The semiconductor light receiving device of claim 1, wherein the light reflecting film is not in contact with a surface of the light receiving section, and at least part of the portion of the resin layer is provided in a gap formed between the light reflecting film and the surface of the light receiving section.

9. The semiconductor light receiving device of claim 7, wherein the refractive index of the anti-reflection coating film is the square root of the product of the refractive index of the semiconductor of the light receiving section and the refractive index of a medium outside the anti-reflection coating film.

10. The semiconductor light receiving device of claim 7, wherein the anti-reflection coating film is a conductive transparent film, the anti-reflection coating film is connected to the electrode, and the anti-reflection coating film serves as an auxiliary electrode.

11. A semiconductor light receiving device comprising:
a light receiving section made of a semiconductor provided on a substrate;
an electrode provided on the substrate and configured to apply an electric field to the light receiving section;
a resin layer provided above the substrate, the resin layer having an inverted conical opening, the inverted conical opening being located above the light receiving section and having an opening diameter which is smaller than the light receiving section in the vicinity of the light receiving section, is continuously enlarged with the distance from the substrate, and is larger than the light receiving section at a surface of the resin layer; and
a light reflecting film made of metal and provided on a bevel of the inverted conical opening, the light reflecting film being electrically isolated from the electrode by a gap formed between the light reflecting film and the electrode,
a light being blocked from being incident on the substrate except the light receiving section.

12. The semiconductor light receiving device of claim 11, wherein the resin layer is entirely made of an opaque resin.

13. The semiconductor light receiving device of claim 11, wherein a light blocking layer is provided under the resin layer at least in the portion of the resin layer located in the gap.

14. The semiconductor light receiving device of claim 11, wherein the inside of the inverted conical opening is a void.

15. The semiconductor light receiving device of claim 11, wherein the inside of the inverted conical opening is filled with a transparent resin.

16. The semiconductor light receiving device of claim 5, wherein the transparent resin has a refractive index close to the transmission refractive index of an optical waveguide coupled to the inverted conical opening.

17. The semiconductor light receiving device of claim 11, further comprising: an anti-reflection coating film provided on a surface of the light receiving section.

18. The semiconductor light receiving device according to claim 11, wherein the light reflecting film is not in contact with a surface of the light receiving section, and at least part of the portion of the resin layer is provided in a gap formed between the light reflecting film and the surface of the light receiving section.

19. The semiconductor light receiving device of claim 17, wherein the refractive index of the anti-reflection coating film is the square root of the product of the refractive index of the semiconductor of the light receiving section and the refractive index of a medium outside the anti-reflection coating film.

20. The semiconductor light receiving device of claim 17, wherein the anti-reflection coating film is a conductive transparent film, the anti-reflection coating film is connected to the electrode, and the anti-reflection coating film serves as an auxiliary electrode.

* * * * *